US006826091B2

(12) United States Patent
Noichi (10) Patent No.: US 6,826,091 B2
(45) Date of Patent: Nov. 30, 2004

(54) SEMICONDUCTOR STORAGE APPARATUS AND WRITING METHOD IN SEMICONDUCTOR STORAGE APPARATUS (75) Inventor: Shuhei Noichi, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/460,674

(22) Filed: Jun. 13, 2003

(65) Prior Publication Data

US 2004/0032767 A1 Feb. 19, 2004

(30) Foreign Application Priority Data

Jun. 13, 2002 (JP) ..................................... P2002-172805

(51) Int. Cl.[7] .............................. G11C 7/00; G11C 8/00
(52) U.S. Cl. ............................. 365/189.05; 365/230.03; 365/230.06; 365/230.08
(58) Field of Search ....................... 365/189.05, 230.03, 365/230.06, 230.08

(56) References Cited

U.S. PATENT DOCUMENTS

| 5,966,340 | A | * | 10/1999 | Fujino et al. | .......... 365/230.03 |
|---|---|---|---|---|---|
| 6,091,667 | A | | 7/2000 | Tanaka et al. | |
| 6,160,753 | A | * | 12/2000 | Shibayama | ............. 365/230.03 |
| 6,201,745 | B1 | * | 3/2001 | Ryu et al. | ............... 365/230.06 |
| 6,208,563 | B1 | * | 3/2001 | Naritake | ................ 365/189.05 |
| 6,587,391 | B2 | * | 7/2003 | Jung et al. | ............. 365/230.03 |
| 6,597,624 | B2 | * | 7/2003 | Aritomi | .................. 365/230.06 |
| 6,661,734 | B2 | * | 12/2003 | Inaba et al. | ............ 365/230.06 |

* cited by examiner

Primary Examiner—Trong Phan
(74) Attorney, Agent, or Firm—McDermott Will & Emery LLP (57) ABSTRACT

A memory cell array is divided into a plurality of areas in a row direction. A group consisting of data writing latch circuits is connected to memory cells in a group consisting of the memory cells arranged in each of the areas, respectively, via a word line. Data lines are individually connected to the latch circuits. Sub word lines are connected commonly to the group consisting of the memory cells at each of the areas. A switching element for a word line is inserted between each of the sub word lines and a main word line. The switching element for the word line is turned on at the area, at which data latching is completed, so as to transmit a potential of a main word line to the sub word line, so that a writing operation is started without waiting for completion of data latching at the other area.

9 Claims, 6 Drawing Sheets

SEMICONDUCTOR STORAGE APPARATUS AND WRITING METHOD IN SEMICONDUCTOR STORAGE APPARATUS

BACKGROUND OF THE INVENTION

The present invention relates to a semiconductor storage apparatus. More particularly, the present invention relates to a semiconductor storage apparatus, in which data writing latch circuits are connected to bit lines in a memory cell array; groups consisting of the latch circuits and groups consisting of memory cells in columns in the memory cell arrays are divided into a plurality of areas in a row direction, and the plurality of latch circuits in each of the areas are connected to individual data lines.

A conventional semiconductor storage apparatus has been configured so that data writing latch circuits are provided on bit lines, for performing a latching operation at predetermined times (i.e., the total number of latch circuits divided by the number of data lines), and a writing operation is performed at the same time after data is set in all of the latch circuits. Here, the total number of latch circuits for simultaneously performing the writing operation is referred to as "one page".

Hereinafter in FIGS. 1-6, "PL" denotes a latching operation, "Program" denotes a data transferring and writing operation, "PV" denotes a verifying operation, and "WAIT" denotes an operation standby. Furthermore, the numeral following "PL," "Program," and The prior art is described below in reference to the drawings. FIG. 6A is a circuit diagram illustrating a semiconductor storage apparatus in the prior art; and FIG. 6B is a flowchart illustrating its operation.

In FIG. 6A, reference numeral 600 represents an area 0 obtained by division in the case of four data lines; 610, an area 1 in the same manner; 601 to 604, memory cells within the area 0 (600); 605 to 608, data writing latch circuits within the area 0 (600); 611 to 614, memory cells within the area 1 (610); 615 to 618, data writing latch circuits within the area 1 (610); 620, a word line; 621, a data line for setting data in the latch circuits 605 to 608 within the area 0 (600); and 622, a data line for setting data in the latch circuits 615 to 618 within the area 1 (610).

The operation of the semiconductor storage apparatus in the prior art configured as described above is explained below in accordance with the flowchart illustrated in FIG. 6B. In the flowchart illustrated in FIG. 6B, the operations in the areas correspond to each other timewise.

First of all, writing data in the area 0 (600) is stored in the latch circuits 605 to 608 (STEP 0).

Next, writing data in the area 1 (610) is stored in the latch circuits 615 to 618 (STEP 1).

In this manner, latch setting of one page is completed.

Subsequently, the word line 620 is set to a predetermined writing voltage level. Thereafter, a verifying operation and a writing operation are repeated until all of the memory cells 601 to 604 and 611 to 614 have reached a predetermined threshold level (STEP 2 to STEP 5).

With the above-described configuration, the parallelism of writing times is great, thereby achieving the writing operation at a relatively high speed.

However, with the above-described configuration, the writing operation is not started until the latch setting of the writing data is completed with respect to each of the latch circuits of one page. Therefore, the completion of the latch setting of the writing data in other areas must be waited for in the area where the writing data has already been set, even if the writing operation has been prepared, thereby raising a problem of a loss in the total writing time.

Furthermore, a data latching operation of the next page is not started until the writing operation of one page is completed. Therefore, the completion of the writing operation in other areas must be waited for at an area, where the writing operation has already been completed, even if latching has been prepared for next data, thereby raising a problem of a loss in the writing time for the entire chip.

Moreover, since the writing operation of one page is started in any area at the same time, the writing time is constant all the time, thereby raising a problem that a speed is determined at a writing speed of the slowest memory cell within one page.

SUMMARY OF THE INVENTION

The present invention has been accomplished in an attempt to solve the above problems observed in the prior art. The principal object of the present invention is to provide a semiconductor storage apparatus and a writing method in a semiconductor storage apparatus, in which data writing processing can be performed at a higher speed.

Other objects, features and advantages of the present invention will become clear from the description below.

In order to achieve the above-described object, as a first embodiment for solving the problems, a semiconductor storage apparatus according to the present invention is predicated on a semiconductor storage apparatus, in which data writing latch circuits are connected to bit lines in a memory cell array, a group consisting of the latch circuits and a group consisting of memory cells in columns in the memory cell array are divided into a plurality of areas in a row direction, and the plurality of latch circuits at each of the areas are connected to individual data lines, respectively. In the above-described semiconductor storage apparatus, the plurality of memory cells at each of the areas are commonly connected to individual sub word lines, and further, the sub word line at each of the areas is connected to a main word line via a switching element for a word line.

In other words, it is construed as follows: a semiconductor storage apparatus according to the present invention comprises: a plurality of areas, each of which is divided in a memory cell array in a row direction; a group consisting of memory cells arranged in each of the areas; a group consisting of data writing latch circuits arranged in each of the areas in connection to each of the memory cells in the group consisting of the memory cells via a word line; data lines individually connected to the latch circuits, respectively; sub word lines connected commonly to the group consisting of the memory cells at each of the areas; and a switching element for a word line inserted between each of the sub word lines and the main word line.

Functions of the above-described configuration are as follows: writing data is latched in the group consisting of the latch circuits at a certain one out of the areas divided in the row direction. Upon completion of the data latching, the processing proceeds to data latching with respect to the group consisting of the latch circuits at the other area. In synchronism with this, the switching element for the word line is turned on at the area, at which the data latching has already been completed, and then, the sub word line is connected to the main word line. Thus, an applied potential of the main word line is transmitted to the group consisting of the memory cells at the area via the switching element and the sub word line, and the data is transferred to and written in the group consisting of the memory cells at the area from the group consisting of the latch circuits after the completion of the data latching. In parallel to the writing data latching at one area, the latch data is written in the memory cells at the other area. In other words, it is unnecessary at the area, at which the data latching has been completed, to wait for the completion of the data latching at the other area. Subsequent to the completion of the data latching, the processing proceeds to the data writing without any substantial wait. Consequently, the data writing processing can be efficiently performed at a high speed.

As a second embodiment for solving the problems, a semiconductor storage apparatus according to the present invention is further configured such that a switching element for the latch circuit is interposed between each of the memory cells and each of the latch circuits, the switching elements for the latch circuits are divided per area, and the plurality of switching elements for the latch circuits at each of the areas are connected commonly to an individual address signal line, in the first embodiment for solving the problems.

In other words, it is construed as follows: a semiconductor storage apparatus according to the present invention comprises: a plurality of areas, each of which is divided in a memory cell array in a row direction; a group consisting of memory cells arranged in each of the areas; a group consisting of data writing latch circuits arranged in each of the areas in connection to each of the memory cells in the group consisting of the memory cells via a word line; data lines individually connected to the latch circuits, respectively; sub word lines connected commonly to the group consisting of the memory cells at each of the areas; a switching element for a word line inserted between each of the sub word lines and a main word line; a switching element for a latch circuit interposed between each of the memory cells and each of the latch circuits; and an address signal line connected commonly to a group consisting of the switching elements for the latch circuits at each of the areas.

Functions of the above-described configuration are as follows: the switching element for the latch circuit is turned off at the area, in which the writing operation has been completed, and then, the electric connection between the memory cell and the latch circuit in the area is cut at the time when the writing operation of one page is not completed. Thereafter, next data is latched with respect to the latch circuit in the area. As a result, in the area, where the writing operation has been completed, the next data can be latched without delay for completion of the data writing operation in the other area. Consequently, time for latching data on the second page and thereafter can be shortened, thereby shortening the total writing time.

With the first or second embodiments for solving the problems, it is further preferable that a memory cell for storing a writing speed priority should be connected to each of the bit lines.

Functions of the above-described configuration are as follows: the information on the writing speed priority per area is stored in the memory cell during the first writing operation. The priority of the data writing is controlled based on the information about the writing speed priority stored in the memory cell during the second and subsequent writing operations. For example, the writing operation is performed while giving priority to the area, at which the writing speed was slow. As a consequence, the second and subsequent writing operations can be performed at a high speed.

As for a writing method in a semiconductor storage apparatus, the above-described problems can be solved by providing means below according to the present invention.

A first embodiment for solving the problems for the writing method in a semiconductor storage apparatus according to the present invention is featured in that latch setting of writing data is sequentially performed per area in the state in which a memory cell array is divided into a plurality of areas in a row direction, and the writing method comprises the following steps. That is to say, in one step, latch setting of writing data is performed at a certain area. In the next step, data after the latch setting at the area, at which the latch setting is completed, is transferred to and written in a memory cell of the area; then the latch setting of the writing data is performed at one of the residual areas; and further, the simultaneous processing of the data writing and the data latching setting is sequentially shifted to the next area untill completion at all of the areas. Namely, the writing method in the semiconductor storage apparatus according to the present invention is featured in that at the area, at which the latch setting has been completed, the data after the latch setting is transferred to and written in the memory cells at the area without delay for the completion of latch setting at the other area.

Functions of the above-described writing method are as follows: when the latch setting of the writing data in the latch circuit is performed per area, there is an area, at which the latch setting has been completed, while there is another area, at which the latch setting has not been completed and the latch setting is started. Like in the prior art, if the data is written in the memory cell after the completion of the latch setting at all of the areas, a waiting time occurs at the area, at which the latch setting has been completed. In contrast, by the writing method according to the present invention, the latch data in the latch circuit after the latch setting is transferred to and written in the memory cell subsequently to the completion of the latch setting without delay for the completion of the latch setting at the other area. Consequently, it is possible to efficiently perform the data writing operation at a high speed. That is to say, it is possible to shorten the total writing time.

In another preferred aspect in the first embodiment for solving the problems of the above-described writing method, a data writing operation to be performed at the area, at which latch setting is completed, during the latch setting at the other area is a weak writing operation at a low level that the memory cell cannot reach a predetermined threshold level by making a potential level of the word line lower than that during a normal writing operation.

Functions of the above-described writing method are as follows: since the threshold level in writing the data in the memory cell is higher than a predetermined threshold level in the normal writing operation, the operation inevitably proceeds to a verifying operation, which requires time. In contrast, in the writing method according to the present invention, a weak writing operation is performed in the state in which the threshold level does not reach the predetermined threshold level by suppressing the word line potential level lower than usual at the time of the data writing during the latch setting in the other area. Thus, it is possible to omit the verifying operation. The omission of the verifying operation is continued until the latch setting at all of the areas is completed. The omission of the verifying operation in the above-described manner can further shorten the total writing time.

In a further preferred aspect in the first embodiment for solving the problems of the above-described writing method, a data writing operation to be performed in the area, where the latch setting is completed, during latch setting in the other area, is a weak writing operation at a low level that the memory cell cannot reach a predetermined threshold level by making a writing pulse width less than that during a normal writing operation.

Functions of the above-described writing method are as follows: since the threshold level in writing the data in the memory cell is higher than a predetermined threshold level in the normal writing operation, the operation inevitably proceeds to a verifying operation, which requires time. In contrast, in the writing method according to the present invention, a weak writing operation is performed in the state in which the threshold level does not reach the predetermined threshold level by reducing the writing pulse width less than usual at the time of the data writing during the latch setting at the other area. Thus, it is possible to omit the verifying operation. The omission of the verifying operation is continued until the latch setting at all of the areas is completed. The omission of the verifying operation in the above-described manner can further shorten the total writing time.

A second embodiment for solving the problems in the writing method in the semiconductor storage apparatus according to the present invention is featured in that the electric connection between each of the latch circuits and each of the memory cells is cut at the area, where the data writing operation is completed, and then, the latch setting of next writing data is performed during the data writing operation at the other area, in the above-described first embodiment for solving the problems.

Functions of the above-described writing method are as follows: the electric connection between each of the latch circuits and each of the memory cells is cut in the area, where the writing operation has been completed, at the time when the writing operation of one page has not been completed. In contrast, the data is written in the other area. In the meantime, next data is latched with respect to the latch circuit in the area, at which the writing operation has been completed. As a result, in the area, where the writing operation has been completed, the next data can be latched without delay for the completion of the data writing operation in the other area. Consequently, time for latching data on the second page and thereafter can be shortened, thereby shortening the total writing time.

A third embodiment for solving the problems in the writing method in the semiconductor storage apparatus according to the present invention is featured in that information on a writing speed priority per area is stored during the data writing operation with respect to the memory cell, and the data writing operation is performed while giving priority to the area of a low priority based on the stored information on the writing speed priority during the second and subsequent writing operations after the completion of the data writing operation in all of the areas, in the above-described first or second embodiments for solving the problems.

Functions of the above-described writing method are as follows: the information on the writing speed priority per area is stored during the first writing operation. The data is written while giving priority to the area of low priority based on the information on the stored writing speed priority during the second and subsequent writing operations. As a consequence, the second and thereafter writing operations can be performed at a high speed.

The foregoing and other aspects will become apparent from the following description of the invention when considered in conjunction with the accompanying drawing figures.

DETAILED DESCRIPTION OF THE PREFERRED EMBODIMENTS

A semiconductor storage apparatus in preferred embodiments according to the present invention is described below in reference to the accompanying drawings.

First Preferred Embodiment

Hereinafter, the first preferred embodiment according to the present invention is described below in reference to FIGS. 1A and 1B.

Figure 1A:
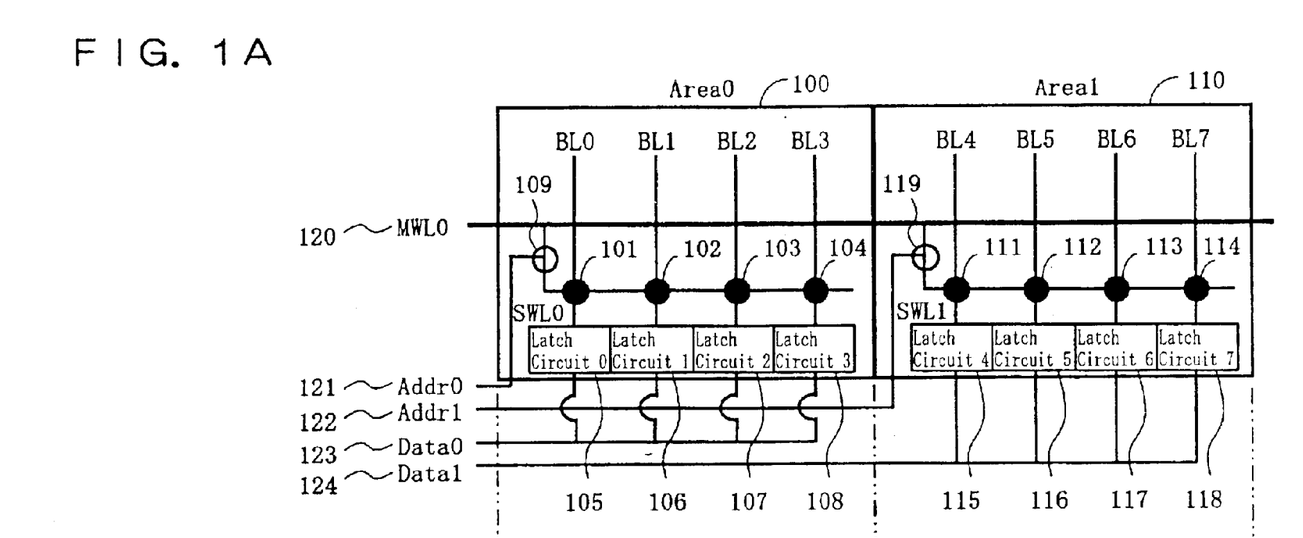
FIG. 1A is a circuit diagram illustrating a semiconductor storage apparatus in a first preferred embodiment according to the present invention.
Figure 1B:
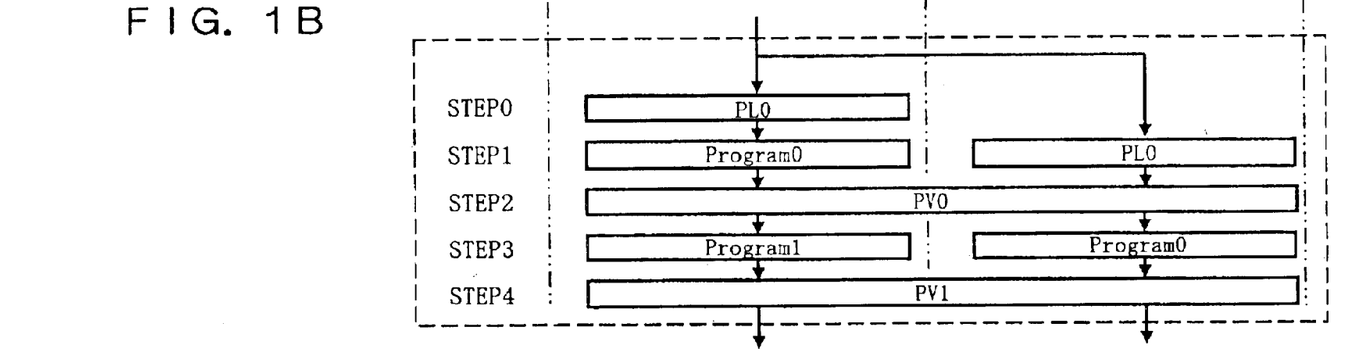
FIG. 1B is a flowchart illustrating the operation of the semiconductor storage apparatus in the first preferred embodiment according to the present invention.

FIG. 1A is a circuit diagram illustrating a semiconductor storage apparatus in the first preferred embodiment according to the present invention; and FIG. 1B is a flowchart illustrating the operation of the semiconductor storage apparatus.

In FIG. 1A, reference numerals 100 and 110 designate an area 0 and an area 1, respectively, in which there are divided a plurality (two, in this case) of memory cell arrays in a row direction. The memory cell array in the area 0 (100) and the area 1 (110) includes numerous memory cells arranged in a vertical and lateral grid pattern (i.e., in a matrix manner). Here, as a typical example, the memory cells of only one column are illustrated in the area 0 (100) and the area 1 (110). For the sake of simplification, a group in one column representatively consists of eight memory cells. Data writing latch circuits 105 to 108 and 115 to 118 are connected to bit lines BL0 to BL7, respectively. The semiconductor storage apparatus is configured so that writing data is supplied to the latch circuits 105 to 108 at the area 0 (100) via a data line 123 having an equivalent bit width; in contrast, writing data is supplied to the latch circuits 115 to 118 in the area 1 (110) via another data line 124 having an equivalent bit width. Gates of a plurality of memory cells 101 to 104 in the area 0 (100) are commonly connected to a sub word line SWL0. Furthermore, the sub word line SWL0 is connected to a main word line 120 via a transistor 109 serving as a switching element for a word line. In contrast, gates of a plurality of memory cells 111 to 114 in the area 1 (110) are commonly connected to another sub word line SWL1. Furthermore, the sub word line SWL1 is connected to the main word line 120 via another transistor 119 serving as a switching element for a word line in the same manner as described above. The sub word line SWL0 and the sub word line SWL1 are wirings independent of each other. A gate of the transistor 109 is connected to an address signal line 121; in contrast, a gate of the other transistor 119 is connected to another address signal line 122.

The above-described memory cells 101 to 104 and 111 to 114, the sub word lines SWL0 and SWL1, the transistors 109 and 119 and the main word line 120 representatively show one column. The plurality of columns, each having the above-described configuration, are arranged in a vertical direction, thereby configuring the memory cell array.

The operation of the semiconductor storage apparatus in the present preferred embodiment such configured as described above is explained below in accordance with the flowchart illustrated in FIG. 1B. In the flowchart illustrated in FIG. 1B, the operations in the areas correspond to each other timewise.

First, the main word line 120 is set to a predetermined writing voltage level. At this time, the transistors 109 and 119 at the areas 0 and 1, respectively, are turned off.

Next, writing data in the area 0 (100) is latched in the latch circuits 105 to 108 (STEP 0).

Subsequently, writing data in the area 1 (110) is latched in the latch circuits 115 to 118. At the same time, the transistor 109 at the area 0 (100), where the latch setting has been already completed, is turned on, so that the sub word lien SWL0 is connected to the main word line 120. Thus, an applied voltage (i.e., the writing voltage level) of the main word line 120 is applied to the gates of the memory cells 101 to 104, and then, the data, which has been latched in the latch circuits 105 to 108, is transferred to and written in the memory cells 101 to 104 (STEP 1).

Thereafter, a verifying operation is performed in order to determine whether or not the writing operation is completed (STEP 2). The verifying operation is performed with respect to the areas 0 (100) and 1 (110) at the same time.

In this manner, the latch setting of one page is completed. Thereafter, the verifying operation and the writing operation are repeated until all of the memory cells 101 to 104 and 111 to 114 reach a predetermined threshold level (STEP 3 and STEP 4).

As described above, in the first preferred embodiment, in parallel to the writing data latching in one area 1 (110), the latch data is written in the memory cells 101 to 104 in the other area 0 (100). In other words, it is unnecessary at the area 0 (100), at which the data latching has been completed, to wait for the completion of the data latching is the other area 1 (110). Subsequent to the completion of the data latching, the processing proceeds to the data writing operation without any substantial wait. Consequently, the data writing processing can be efficiently performed at a high speed. That is to say, it is possible to shorten the total writing time.

Second Preferred Embodiment

Hereinafter, a second preferred embodiment according to the present invention is described below in reference to FIGS. 2A and 2B.

Figure 2A:
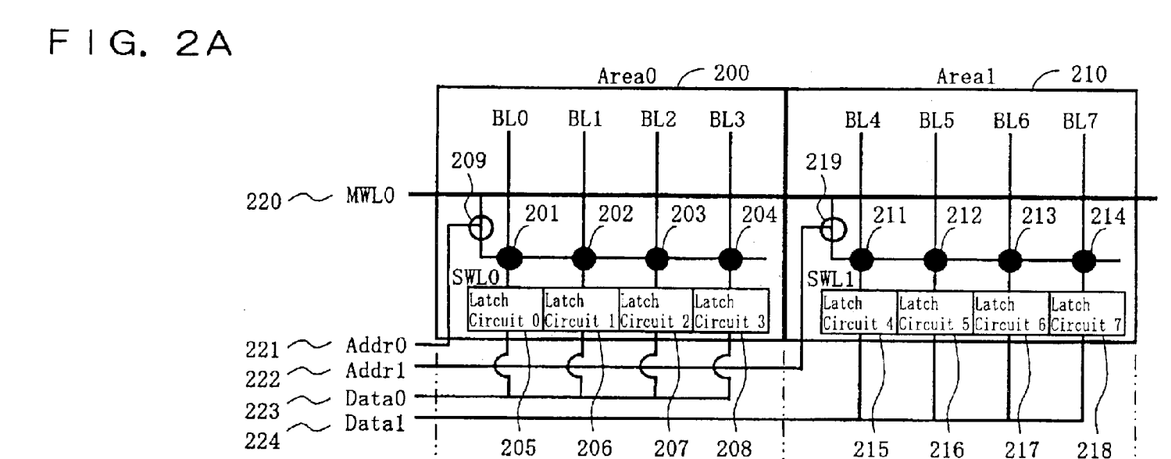
FIG. 2A is a circuit diagram illustrating a semiconductor storage apparatus in a second preferred embodiment according to the present invention.
Figure 2B:
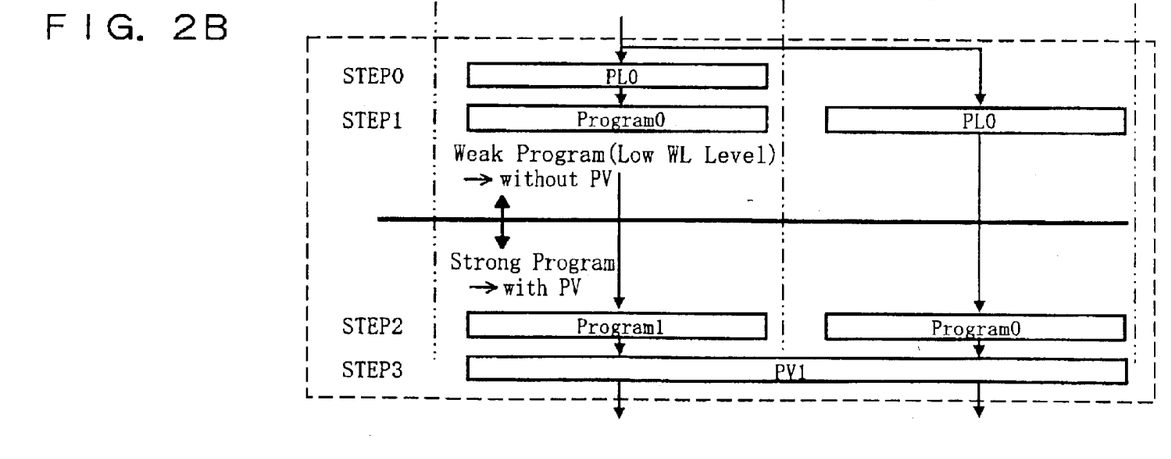
FIG. 2B is a flowchart illustrating the operation of the semiconductor storage apparatus in the second preferred embodiment according to the present invention.

FIG. 2A is a circuit diagram illustrating a semiconductor storage apparatus in the second preferred embodiment according to the present invention; and FIG. 2B is a flowchart illustrating the operation of the semiconductor storage apparatus. Constituents 200 to 224 in the circuit diagram illustrated in FIG. 2A are the same as the constituents 100 to 124 in the circuit diagram illustrated in FIG. 1A. In other words, in FIG. 2A, reference numerals corresponding to numerical values obtained by adding 100 to reference numerals in FIG. 1A (for example, reference numeral 200 in FIG. 2A with respect to reference numeral 100 in FIG. 1A) designate the same constituent elements. The configuration of the circuit is the same as that illustrated in FIG. 1A, although a control system is different.

The operation of the semiconductor storage apparatus in the present preferred embodiment is explained below in accordance with the flowchart illustrated in FIG. 2B.

The operation of the semiconductor storage apparatus in the present preferred embodiment is basically the same as that of the semiconductor storage apparatus in the first preferred embodiment. The difference from that of the semiconductor storage apparatus in the first preferred embodiment is in that a writing operation at the time when data latching operation has not been completed is performed at a potential level of a word line lower than that in a normal writing operation at a weak level at which a memory cell does not reach a predetermined threshold level, and no verifying operation is performed (STEP 0 and STEP 1).

As described above, in the second preferred embodiment, in the area, where the data latching has been completed, the writing operation can be started without delay for the completion of the data latching at the other area. Furthermore, a verifying operation can be omitted during the writing operation at the time when the data latching operation has not been completed. By the above-described synergistic effect, it is possible to shorten the total writing time.

Third Preferred Embodiment

Hereinafter, a third preferred embodiment according to the present invention is described below in reference to FIGS. 3A and 3B.

Figure 3A:
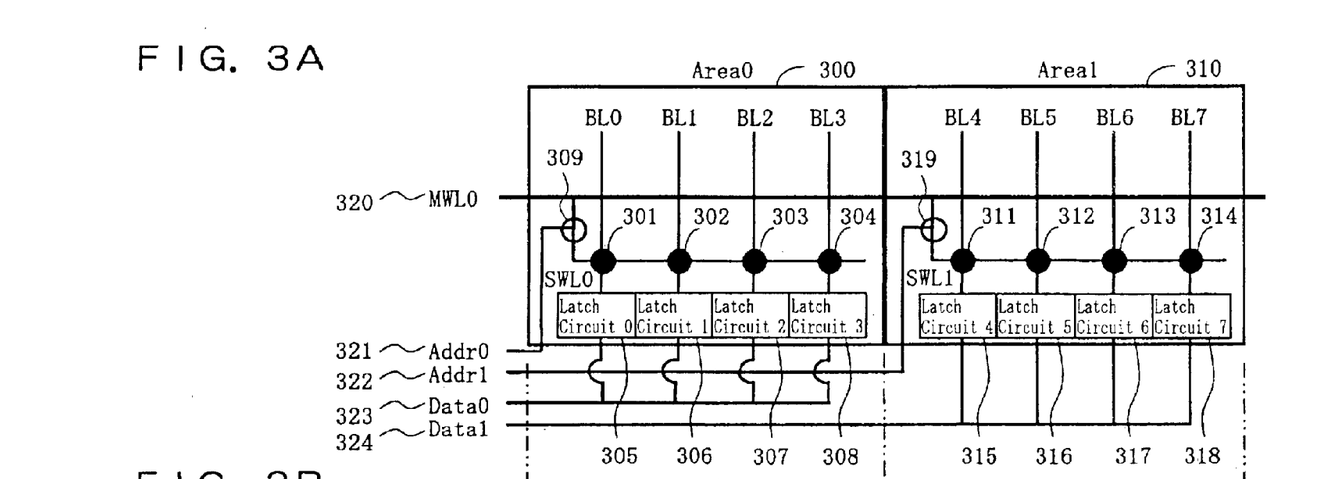
FIG. 3A is a circuit diagram illustrating a semiconductor storage apparatus in a third preferred embodiment according to the present invention.
Figure 3B:
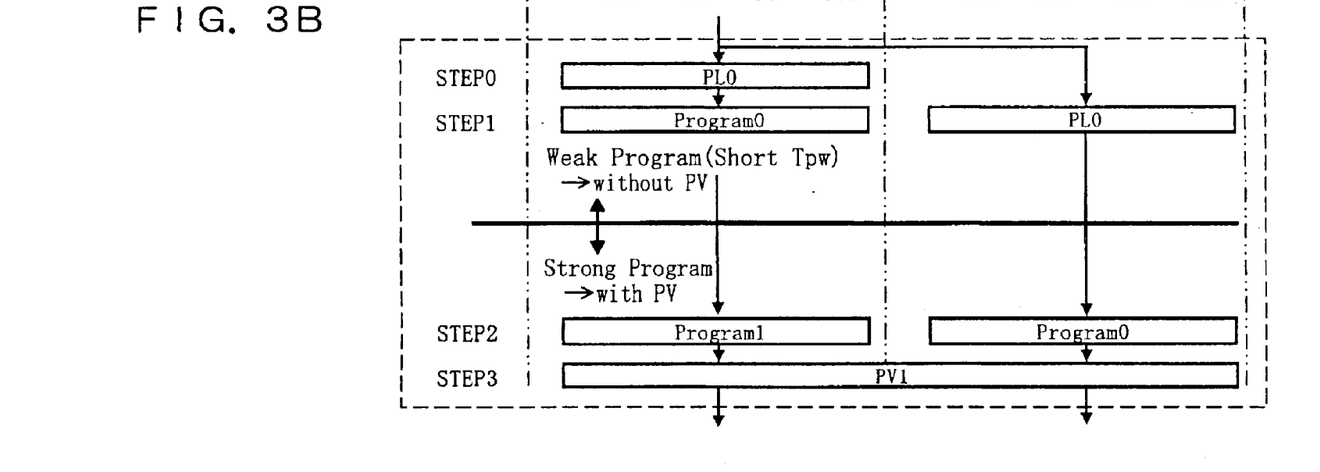
FIG. 3B is a flowchart illustrating the operation of the semiconductor storage apparatus in the third preferred embodiment according to the present invention.

FIG. 3A is a circuit diagram illustrating a semiconductor storage apparatus in the third preferred embodiment according to the present invention; and FIG. 3B is a flowchart illustrating the operation of the semiconductor storage apparatus. Constituents 300 to 324 in the circuit diagram illustrated in FIG. 3A are the same as those of the constituents 200 to 224 in the circuit diagram illustrated in FIG. 2A. In other words, in FIG. 3A, reference numerals corresponding to numerical values obtained by adding 100 to reference numerals in FIG. 2A (for example, reference numeral 300 in FIG. 3A with respect to reference numeral 200 in FIG. 2A) designate the same constituent elements. The configuration of the circuit is the same as that illustrated in FIG. 2A, although a control system is different.

The operation of the semiconductor storage apparatus in the present preferred embodiment is explained below in accordance with the flowchart illustrated in FIG. 3B.

The operation of the semiconductor storage apparatus in the present preferred embodiment is basically the same as that of the semiconductor storage apparatus in the second preferred embodiment. The difference from that of the semiconductor storage apparatus in the second preferred embodiment is in a writing operation at the time when data latching operation has not been completed. In the second preferred embodiment, the weak writing operation is performed at a potential level of a word line lower than that in a normal writing operation. In contrast, in the present preferred embodiment, a potential level of a word line is set to the same level as that in the normal writing operation, although a weak writing operation is performed at a reduced writing pulse width (STEP 0 and STEP 1). Also in the present preferred embodiment, a verifying operation can be omitted in the same manner as in the second preferred embodiment.

As described above, in the third preferred embodiment, at the area, where the data latching has been completed, the writing operation can be started without delay for the completion of the data latching in the other area. Furthermore, a verifying operation can be omitted during the writing operation at the time when the data latching operation has not been completed. By the above-described synergistic effect, it is possible to shorten the total writing time.

Fourth Preferred Embodiment

Hereinafter, a fourth preferred embodiment according to the present invention is described below in reference to FIGS. 4A and 4B.

Figure 4A:
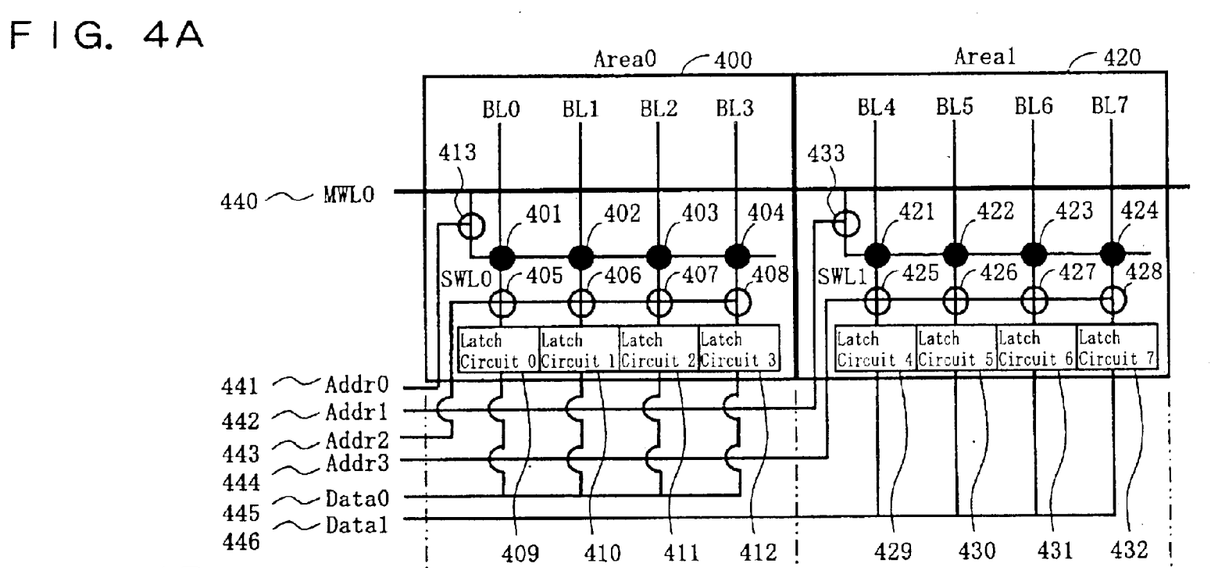
FIG. 4A is a circuit diagram illustrating a semiconductor storage apparatus in a fourth preferred embodiment according to the present invention.
Figure 4B:
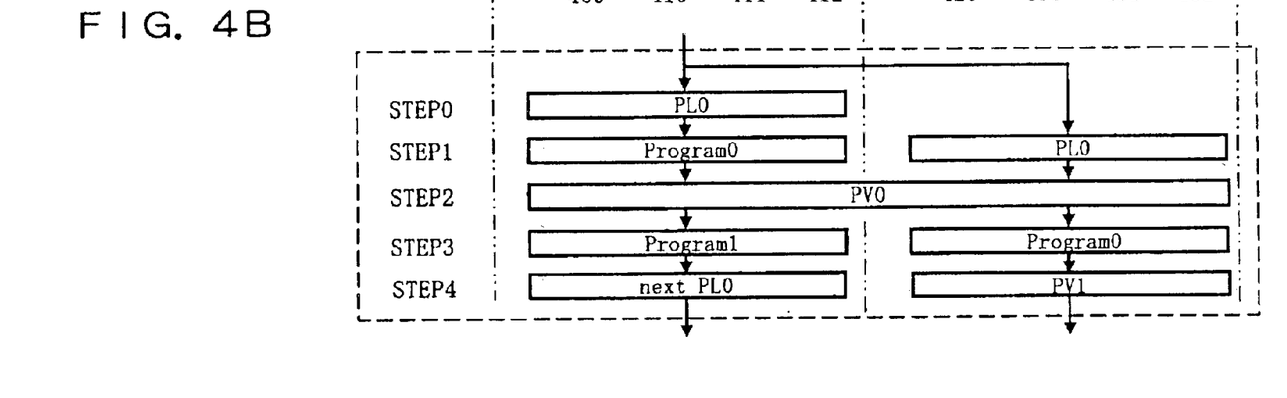
FIG. 4B is a flowchart illustrating the operation of the semiconductor storage apparatus in the fourth preferred embodiment according to the present invention.

FIG. 4A is a circuit diagram illustrating a semiconductor storage apparatus in the fourth preferred embodiment according to the present invention; and FIG. 4B is a flowchart illustrating the operation of the semiconductor storage apparatus.

In FIG. 4A, reference numeral 400 represents a divided area 0 in the case where there are four data lines; 420, area 1 like the area 0; 401 to 404, memory cells in the area 0 (400); 409 to 412, data writing latch circuits within the area 0 (400); 413, a transistor serving as a switching element for a word line within the area 0 (400); 421 to 424, memory cells in the area 1 (420); 429 to 432, data writing latch circuits within the area 1 (420); 433, a transistor serving as a switching element for a word line within the area 1 (420); 440, a main word line; SWL0 and SWL1, sub word lines; 441, an address signal for controlling the transistor 413 in the area 0 (400); 442, an address signal for controlling the transistor 433 in the area 1 (420); 445, a data line for setting data in the latch circuits 409 to 412 within the area 0 (400); and 446, a data line for setting data in the latch circuits 429 to 432 within the area 1 (420). The above-described constituent elements are the same as those in the first preferred embodiment illustrated in FIG. 1A. Additional constituent elements different from those in the first preferred embodiment illustrated in FIG. 1A include transistors 405 to 408 and 425 to 428 serving as switching elements for the latch circuits interposed between bit lines BL0 to BL7 and the latch circuits 409 to 412 and 429 to 432, respectively; an address signal 443 for controlling the transistors 405 to 408; and an address signal 444 for controlling the transistors 425 to 428.

The operation of the semiconductor storage apparatus in the present preferred embodiment such configured as described above is explained below in accordance with the flowchart illustrated in FIG. 4B.

The operation of the semiconductor storage apparatus in the present preferred embodiment is basically the same as that of the semiconductor storage apparatus in the first preferred embodiment. The difference from the semiconductor storage apparatus in the first preferred embodiment is in that the bit lines are disconnected from the latch circuits at the area, where the writing operation has been completed, at the time when the writing operation of one page has not been completed, and then, next data is latched (STEP 4).

As described above, in the fourth preferred embodiment, at the area, where the data latching has been completed, the writing operation can be started without delay for the completion of the data latching at the other area. Furthermore, the next data can be latched in the area, where the writing operation has been completed, at the time when the writing operation of one page has not been completed. By the above-described synergistic effect, it is possible to shorten data latching time of the second page and thereafter, thereby shortening the total writing time.

Incidentally, the technique of the omission of the verifying operation in the second or third preferred embodiment is combined with the present preferred embodiment, thereby further shortening the time.

Fifth Preferred Embodiment

Hereinafter, a fifth preferred embodiment according to the present invention is described below in reference to FIGS. 5A and 5D. Also, in FIG. 5C, "Slowest" denotes the area of the slowest in the first writing a operation, and "Second Slowest" denotes the area of the second slowest.

Figure 5A:
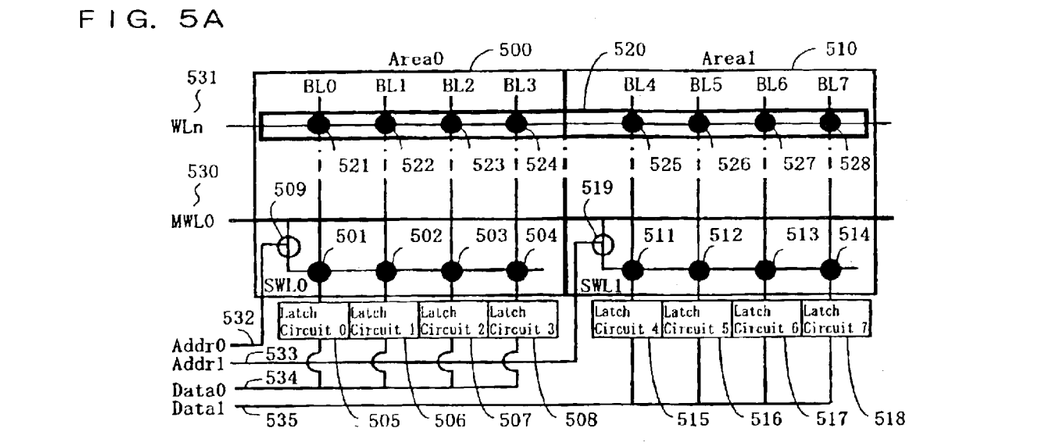
FIG. 5A is a circuit diagram illustrating a semiconductor storage apparatus in a fifth preferred embodiment according to the present invention.
Figure 5B:
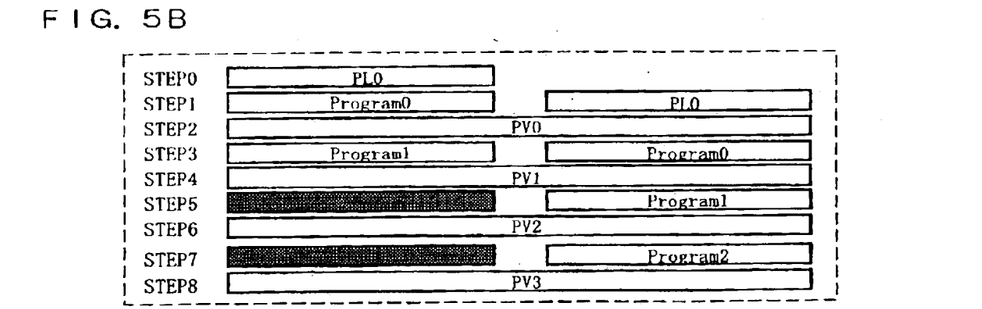
FIGS. 5B to 5D are flowcharts illustrating the operation of the semiconductor storage apparatus in the fifth preferred embodiment according to the present invention.
Figure 5C:
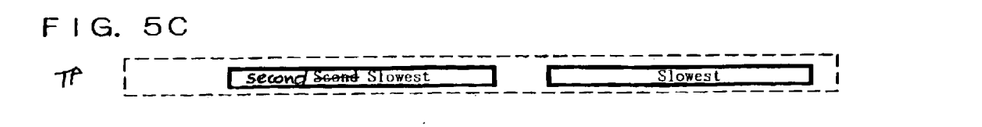
Figure 5D:
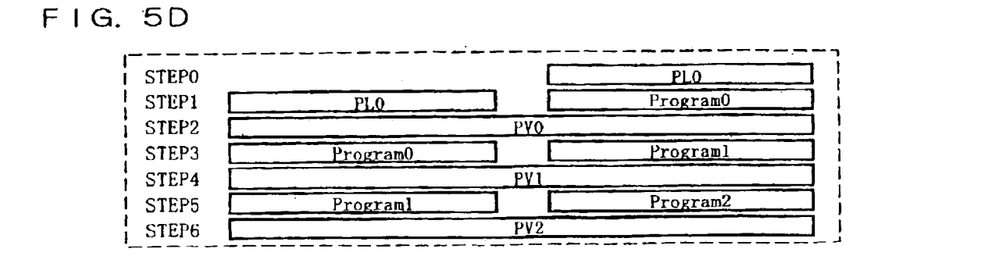
Figure 6A:
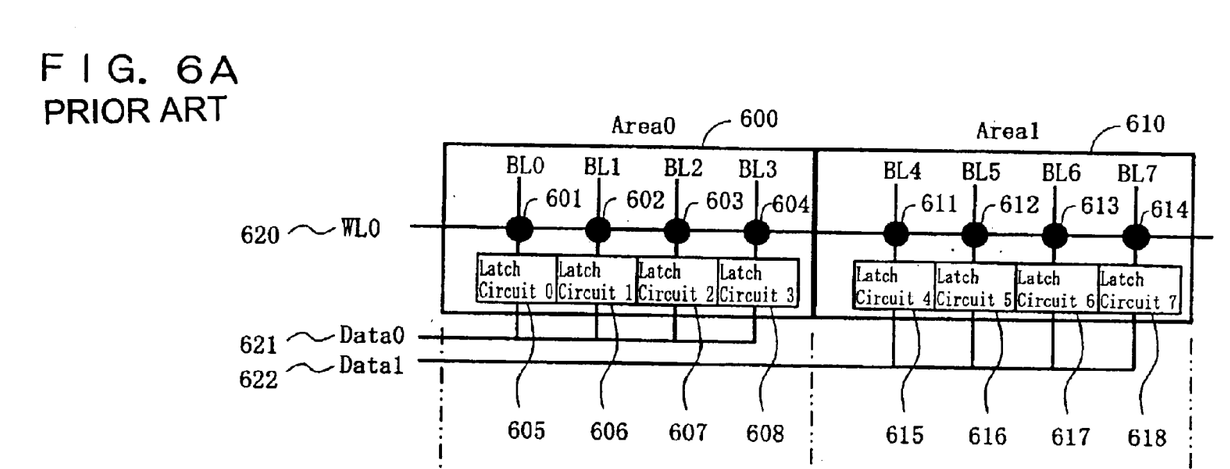
FIG. 6A is a circuit diagram illustrating a semiconductor storage apparatus in the prior art.
Figure 6B:
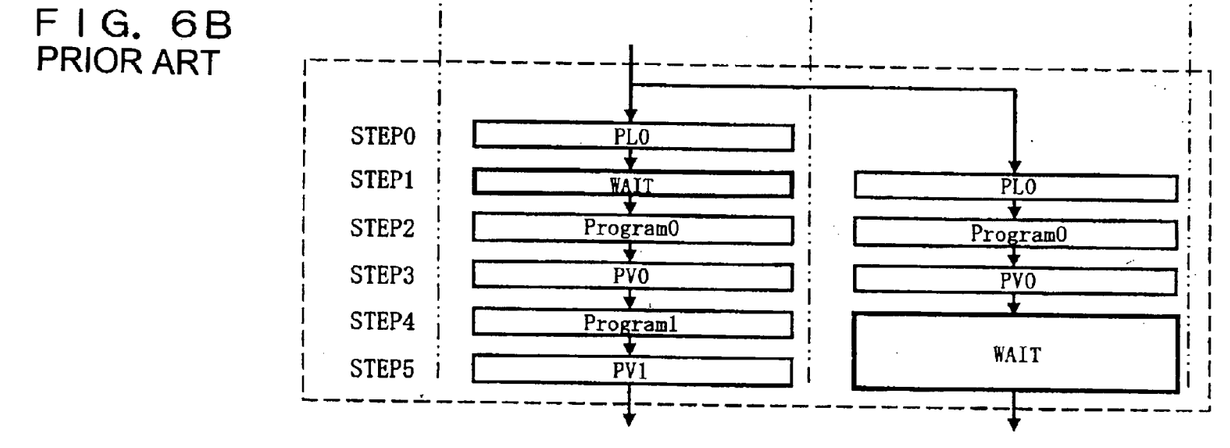
FIG. 6B is a flowchart illustrating the operation of the semiconductor storage apparatus in the prior art.

FIG. 5A is a circuit diagram illustrating a semiconductor storage apparatus in the fifth preferred embodiment according to the present invention; and FIGS. 5B to 5D are flowcharts illustrating the operation of the semiconductor storage apparatus.

In FIG. 5A, reference numeral 500 represents a divided area 0 in the case where there are four data lines; 510, an area 1 like the area 0; 501 to 504, memory cells within the area 0 (500); 505 to 508, data writing latch circuits within the area 0 (500); 509, a transistor serving as a switching element for a word line within the area 0 (500); 511 to 514, memory cells within the area 1 (510); 515 to 518, data writing latch circuits within the area 1 (510); 519, a transistor serving as a switching element for a word line within the area 1 (510); 520, an option area; 521 to 528, memory cells for storing therein a writing speed priority in the option area 520; 530, a main word line; 531, a word line in the option area; 532, an address signal for controlling the transistor 509 in the area 0 (500); 533, an address signal for controlling the transistor 519 in the area 1 (510); 534, a data line for setting data in the latch circuits 505 to 508 within the area 0 (500); and 535, a data line for setting data in the latch circuits 515 to 518 within the area 1 (510). FIG. 5B is a flowchart illustrating the first writing operation per area; FIG. 5C is an explanatory diagram illustrating the first writing result; and FIG. 5D is a flowchart illustrating the second and subsequent writing operations per area.

The operation of the semiconductor storage apparatus in the present preferred embodiment such configured as described above is explained below in accordance with the flowcharts illustrated in FIGS. 5B to 5D.

First of all, the main word line 530 is set to a predetermined writing voltage level. At this time, the transistors 509 and 519 in the areas 0 and 1, respectively, are turned off. Next, writing data in the area 0 (500) is stored in the latch circuits 505 to 508 (STEP 0 in FIG. 5B). Subsequently, writing data in the area 1 (510) is stored in the latch circuits 515 to 518. At the same time, the transistor 509 is turned on, and then, a writing operation is performed with respect to the memory cells 501 to 504 (STEP 1 in FIG. 5B). Thereafter, a verifying operation is performed in order to determine whether or not the writing operation is completed (STEP 2 in FIG. 5B).

Herewith, the latch setting of one page is completed, so that the verifying operation and the writing operation are repeated until all of the memory cells 501 to 504 and 511 to 514 reach a predetermined threshold level (STEP 3 to STEP 8 in FIG. 5B).

In this manner, the first writing operation is completed. Next, the memory cells 521 to 528 in the option area store therein the first writing speed priority per area (FIG. 5C). Information on the writing speed priority is represented by a plurality of bits. The memory cells 521 to 528 of a plurality of bits are arranged in a manner corresponding to the plurality of bits of the information on the writing speed priority.

As to the second and subsequent writing operations, the writing operation is performed in sequence from the area where the first writing operation is slow in reference to the information stored at the option area 520 (STEP 0 to STEP 6 in FIG. 5D).

As described above, in the fifth preferred embodiment, the writing operation is performed in sequence while giving priority to the area, at which the writing speed is low, so that the second and thereafter writing operations can be performed at a high speed.

Incidentally, the technique of the omission of the verifying operation in the second or third preferred embodiment or the technique of the next data latching during the writing operation in the fourth preferred embodiment is combined with the present preferred embodiment, thereby further shortening the time.

The memory cell information at the option area can be read by using an outside rewriting device (such as a tester or a writer) or automatically reading by means of an inside circuit.

Although the writing operation at a high speed is achieved by using the word line of a hierarchy type in the preferred embodiments according to the present invention, it is to be understood that the embodiment for dividing the area for the purpose of the production of the same effect is not limited to the word line.

As described above, the waiting time at the area, at which the data latching has already been completed, or at the area, at which the writing operation has already been completed, is effectively used according to the present invention. Furthermore, the correlation is provided between the writing speed and the writing order at each of the areas. It is possible to provide an excellent semiconductor storage apparatus and an excellent writing method in the semiconductor storage apparatus, in which the writing operation can be performed more efficiently at the higher speed by the above-described synergistic effect in comparison with the writing method in the prior art.

From the above description, it will be apparent that the present invention provides.

What is claimed is:

1. A semiconductor storage apparatus comprising:
    a plurality of areas, each of which is divided in a memory cell array in a row direction;
    a group consisting of memory cells arranged in each of the areas;
    a group consisting of data writing latch circuits arranged in each of the areas in connection to each of the memory cells in the group consisting of the memory cells via a word line;
    data lines individually connected to the latch circuits, respectively;
    sub word lines connected commonly to the group consisting of the memory cells at each of the areas; and
    a switching element for a word line inserted between each of the sub word lines and a main word line.

2. A semiconductor storage apparatus as claimed in claim 1, further comprising memory cells for storing therein a writing speed priority, interposed between bit lines, respectively.

3. A semiconductor storage apparatus comprising:
    a plurality of areas, each of which is divided in a memory cell array in a row direction;
    a group consisting of memory cells arranged in each of the areas;
    a group consisting of data writing latch circuits arranged in each of the areas in connection to each of the memory cells in the group consisting of the memory cells via a word line;
    data lines individually connected to the latch circuits, respectively;
    sub word lines connected commonly to-the group consisting of the memory cells at each of the areas;
    a switching element for a word line inserted between each of the sub word lines and a main word line;
    a switching element for a latch circuit interposed between each of the memory cells and each of the latch circuits; and
    an address signal line connected commonly to a group consisting of the switching elements for the latch circuits at each of the areas.

4. A semiconductor storage apparatus as claimed in claim 3, further comprising memory cells for storing therein a writing speed priority, interposed between bit lines, respectively.

5. A writing method in a semiconductor storage apparatus, in which latch setting of writing data is sequentially performed per area in the state in which a memory cell array is divided into a plurality of areas in a row direction, the writing method comprising the steps of:
    performing latch setting of writing data at a certain area; and
    transferring and writing, to and in a memory cell of the area, data after the latch setting at the area, at which the latch setting is completed, performing the latch setting of the writing data at one of the residual areas, and further, sequentially shifting the simultaneous processing of the data writing and the data latch setting to a next area till completion at all of the areas.

6. A writing method in a semiconductor storage apparatus as claimed in claim 5, wherein a data writing operation to be performed at the area, at which the latch setting is completed, during latch setting at the other area is a weak writing operation at a low level that the memory cell cannot reach a predetermined threshold level by making a potential level of the word line lower than that during a normal writing operation.

7. A writing method in a semiconductor storage apparatus as claimed in claim 5, wherein a data writing operation to be performed at the area, at which the latch setting is completed, during latch setting at the other area is a weak writing operation at a low level that the memory cell cannot reach a predetermined threshold level by making a writing pulse width less than that during a normal writing operation.

8. A writing method in a semiconductor storage apparatus as claimed in claim 5, wherein the electric connection between each of the latch circuits and each of the memory cells is cut at the area, at which the data writing operation is completed, and then, the latch setting of next writing data is performed during the data writing operation at the other area.

9. A writing method in a semiconductor storage apparatus as claimed in claim 5, wherein information on a writing speed priority per area is stored during the data writing operation with respect to the memory cell, and the data writing operation is performed while giving priority to the area of a low priority based on the stored information on the writing speed priority during the second and thereafter writing operations after the completion of the data writing operation at all of the areas.

* * * * *